United States Patent [19]
Koike et al.

[11] Patent Number: 5,795,663
[45] Date of Patent: Aug. 18, 1998

[54] MAGNETORESISTIVE MULTILAYER FILM AND METHODS OF PRODUCING THE SAME

[75] Inventors: Fumihito Koike; Naoya Hasegawa, both of Niigata-ken, Japan

[73] Assignee: Alps Electric Co., Ltd., Japan

[21] Appl. No.: 652,223

[22] Filed: May 23, 1996

[30] Foreign Application Priority Data

May 26, 1995 [JP] Japan ................. 7-128659

[51] Int. Cl.$^6$ ............................................. G11B 5/66
[52] U.S. Cl. ................. 428/692; 428/694 R; 428/694 T; 428/694 TS; 428/694 TM; 428/900; 428/336; 360/113; 360/126; 324/252; 427/128; 427/131; 427/132; 204/192.2
[58] Field of Search ................. 428/692, 694 R, 428/694 T, 694 TS, 694 TM, 800, 336; 380/113, 126; 324/252; 427/128, 131, 132; 204/192.2

[56] References Cited

U.S. PATENT DOCUMENTS 5,159,513  10/1992  Dieny ..................... 360/113
5,549,978  8/1996  Iwasaki ................... 428/692

*Primary Examiner*—Leszek Kiliman
*Attorney, Agent, or Firm*—Brinks Hofer Gilson & Lione

[57] ABSTRACT

A magnetoresistive multilayer film comprises at least a pair of a first and a second ferromagnetic layers provided with a nonmagnetic layer therebetween and laminated on a substrate, at least one of the pair of a first and a second ferromagnetic layers comprising at least two different kinds of magnetic materials, no clear interface existing between the different magnetic materials, and a concentration gradient in the ferromagnetic layer.

25 Claims, 5 Drawing Sheets

MAGNETORESISTIVE MULTILAYER FILM AND METHODS OF PRODUCING THE SAME

BACKGROUND OF THE INVENTION

1. Field of the Invention

The present invention relates to a magnetoresistive multilayer film structure for a magnetoresistive device employed in a magnetic head, position sensor, rotation sensor or the like.

2. Description of the Related Art

An Ni—Fe alloy (Permalloy) is a known magnetoresistive (MR) material which has been used for forming thin-films for MR devices. Generally, the percentage change in magnetoresistance of a Permalloy thin-film is within a range of from 2 to 3%. Accordingly, magnetoresistive materials exhibiting magnetoresistive ratios (MR ratios) greater than that of Permalloy have been in demand for coping with increases in the linear density and the track density in magnetic recording or an increase in the resolving power of magnetic sensors.

Recently, a phenomenon called giant magnetoresistive effect has been found in multilayer thin-film structures, such as a structure consisting of alternate layers of Fe thin-films and Cu thin-films or alternate layers of Co thin-films and Cu thin-films. In those multilayer thin-film structures, the magnetizations of the ferromagnetic layers made of Fe or Co magnetically interact with each other through a nonmagnetic metallic layer made of Cr or Cu, and couple such that the magnetizations of the upper and lower ferromagnetic layers are maintained in antiparallel alignment. That is, each pair of the ferromagnetic layers separated by a nonmagnetic layer is laminated so as to direct the magnetization in the opposite direction when a zero external magnetic field is applied. If an appropriate external magnetic field is applied to multilayer thin-film structures, the magnetization direction of each of the ferromagnetic layers is aligned in the same direction.

In the afore-mentioned structures, it is said that the magnetizations of the ferromagnetic layers in antiparallel alignment differ from those in parallel alignment with respect to the scattering mode of conduction electrons at the interface between the ferromagnetic Fe layers and the nonmagnetic Cr layers or between the ferromagnetic Co layers and the nonmagnetic Cu layers, depending upon the spins of the conduction electrons. Consequently, the above mechanism provides a so-called giant magnetoresistive effect, which exhibits a greater change rate in magnetoresistance as compared with the conventional Permalloy thin-film; in other words, the electric resistance is high when the magnetization directions of the ferromagnetic layers are in antiparallel alignment, whereas the electrical resistance is low when the magnetization directions are in parallel alignment. As above mentioned, these multilayer thin-film structures have an MR generating mechanism fundamentally different from that of the conventional single-layer Ni—Fe film structures.

However, in those multilayer thin-film structures there occurs an excessively-strong magnetic interaction between the ferromagnetic layers, which interaction operates to set the magnetizations of the ferromagnetic layers in antiparallel alignment. Thus, a very intense external magnetic field must be applied thereto to align the magnetization directions of the ferromagnetic layers in parallel. Therefore, a large magnetoresistance change cannot be expected unless a very intense magnetic field is applied to the multilayer thin-film structures. Hence, a satisfactory high sensitivity cannot be obtained when the multilayer thin-film structure is employed in a device for detecting a very small magnetic field of a magnetic recording medium, such as a magnetic head.

It may be effective for solving the foregoing problems to regulate the thickness of the nonmagnetic layers made of Cr or Cu so as to avoid an excessively-strong magnetic interaction between the ferromagnetic layers and to control the relative magnetization directions of the ferromagnetic layers by a method different from the magnetic interaction.

Conventionally, a technique is proposed to control the relative directions of the magnetization in ferromagnetic layers by employing an exchange bias layer made of an antiferromagnetic material, such as an Fe—Mn alloy. According to this technique, the magnetization direction of one ferromagnetic layer is fixed not to be altered by an external magnetic field and the magnetization of the other ferromagnetic layer is allowed to change freely. It therefore becomes possible to operate the multilayer thin-film structure by an applied magnetic field of a very low intensity.

FIG. 7 shows a magnetoresistive sensor disclosed in U.S. Pat. No. 5,159,513 employing the foregoing technique. The magnetoresistive sensor A shown in FIG. 7 is obtained by providing a first magnetic layer 2, a nonmagnetic layer 3, a second magnetic layer 4 and an exchange bias layer 5 on a nonmagnetic substrate 1. The magnetization direction B of the second magnetic layer 4 is fixed by the magnetic exchange coupling of the exchange bias layer 5, and in the absence of an applied magnetic field, the magnetization direction C of the first magnetic layer 2 is arranged perpendicular to the magnetization direction B of the second magnetic layer 4. Since the magnetization direction C of the first magnetic layer 2 is not fixed, it can be readily rotated by a trace amount of applied external magnetic field.

Further, in the structure shown in FIG. 7, the first magnetic layer 2 is required to have excellent soft magnetic characteristics to allow the magnetization direction thereof to be readily rotated by a trace amount of applied external magnetic field.

From the above facts, in the foregoing structure, a preferable magnetic material for the first magnetic layer 2 is an alloy of Ni—Fe, Ni—Co, Co—Zr, Co—Mo—Nb, Ni—Fe—Co or the like.

When a magnetic field h is applied to the structure shown in FIG. 7, the magnetization direction C of the first magnetic layer 2 rotates according to the directions of the applied magnetic field h as is indicated by the dotted arrows. Consequently, the magnetization directions of the first magnetic layer 2 and the second magnetic layer 4 become different from each other, resulting in a magnetoresistance change. It is thereby possible to detect the applied magnetic field.

FIG. 8 shows another example of a magnetoresistive sensor in which the magnetization direction of one magnetic layer is fixed while that of the other magnetic layer is free. As shown in FIG. 8, the magnetoresistive sensor B is composed of an exchange bias layer 7 made of NiO, a magnetic layer 8 made of an Ni—Fe alloy, a nonmagnetic metallic layer 9 made of Cu, a magnetic layer 10 made of an Ni—Fe alloy, a nonmagnetic metallic layer 11 made of Cu, a magnetic layer 12 made of an Ni—Fe alloy, and an exchange bias layer 13 made of an Fe—Mn alloy, which layers are sequentially laminated in that order on a substrate 6.

In this structure, the magnetization directions of the ferromagnetic layers 8 and 12 are fixed by the exchange bias layers 7 and 13 adjacent thereto, while the magnetization directions of the ferromagnetic layer 10, which is sandwiched between the nonmagnetic layers 9 and 11 and disposed between the ferromagnetic layers 8 and 12, are arranged to be readily rotated according to an applied external magnetic field.

In the magnetoresistive sensor having the structure shown in FIG. 7 or 8, the electrical resistance of the magnetoresistive sensor A or B linearly changes with high sensitivity in response to a very small change of the applied magnetic field. When the first magnetic layer 2 is made of a soft magnetic material, for example, an Ni—Fe alloy, it is possible to take advantage of the soft magnetic characteristics thereof, such as low hysteresis.

FIG. 9 shows a known magnetoresistive sensor C which has a structure different from those shown in FIGS. 7 and 8. There is illustrated a nonmagnetic layer 16 made of Cu, a hard magnetic material layer 17 comprising Co, Co—Pt, Co—Cr—Ta, or the like, a nonmagnetic layer 18 made of Cu, and a soft magnetic material layer 19 made of an Ni—Fe alloy, which layers are repeatedly laminated on a glass substrate 15.

In the magnetoresistive sensor C having the structure shown in FIG. 9, it is possible to arrange the magnetization directions of both magnetic layers 17 and 19 in parallel or antiparallel alignment by utilizing the coercive-force difference between the hard magnetic material layer 17 and the soft magnetic material layer 19 and by adjusting the thickness of the nonmagnetic layer 18 to a predetermined value. Thus, the giant magnetoresistive effect can be achieved. Since the number of layers is variable in the magnetoresistive sensor C, the sensor is regarded to exhibit a greater MR ratio by increasing the layers thereof, as compared with those having the structures shown in FIGS. 7 and 8.

In the magnetoresistive sensor having the structure shown in FIG. 7, it is considered that the maximum change rate of the magnetoresistance (ΔMR) is obtained when the first magnetic layer 2 and the second magnetic layer 4 are made of Co or a Co alloy including 10 at % of Fe and the nonmagnetic layer 3 is made of Cu.

If the first magnetic layer 2 is made of Co or an Fe—Co alloy, however, the coercive force thereof increases excessively such that the magnetoresistance can be altered only by a strong applied magnetic field. Thus, for practical use, the first magnetic layer 2 is required to be composed of a soft magnetic material, for instance, an Ni—Fe alloy, Co—Fe—Ni alloy, or the like, to have such magnetoresistance that is altered readily by a lower applied magnetic field. As a result, ΔMR decreases in comparison to the foregoing case, wherein both magnetic layers 2 and 4 are made of Co or a Co alloy including 10 at % of Fe.

Moreover, a similar problem has been indicated in the structure shown in the sensor C of FIG. 9, in which the nonmagnetic layer 18 made of Cu is sandwiched between the hard magnetic material layer 17 made of Co, etc. and the soft magnetic material layer 19 made of an Ni—Fe alloy or the like.

SUMMARY OF THE INVENTION

In view of the above-described problems, the present invention is aimed at providing a magnetoresistive multilayer film structure and a method of manufacturing the same. The magnetoresistive multilayer film structure exhibits a large change rate of magnetoresistance due to a small change in an applied magnetic field, which advantage is achieved by specially designing the structure of the magnetic layers sandwiching the nonmagnetic layer.

To achieve the object, in accordance with an aspect of the present invention, there is provided a magnetoresistive multilayer film comprising at least a pair of ferromagnetic layers provided with a nonmagnetic layer therebetween and laminated on a substrate, at least one of the pair of ferromagnetic layers comprising at least two different kinds of magnetic materials.

It is preferable that the ferromagnetic layer comprising at least two different kinds of magnetic materials of the pair of ferromagnetic layers is composed of a thin-film layer comprising the constituent of the other ferromagnetic layer, and a main layer comprising at least another ferromagnetic material and being thicker than the thin-film layer.

It is preferable that the ferromagnetic layer comprising at least two different kinds of magnetic materials of the pair of ferromagnetic layers has a concentration gradient of the constituent of the other ferromagnetic layer; and the concentration of the constituent is arranged high in the nonmagnetic layer side and low in the opposite side.

Further, it is preferable that the thickness of a region having 80 atom % or more of the concentration of the constituent of the other ferromagnetic layer is 5 Å or more measuring from the interface with the nonmagnetic layer, and the thickness of a region of the concentration gradient is one half of the ferromagnetic layer or less.

Furthermore, it is preferable that an exchange bias layer pinning the magnetization direction of the ferromagnetic layer is provided on the ferromagnetic layer at the opposite side of the nonmagnetic layer.

In the above structure, a magnetoresistive multilayer film may be obtained by laminating a plurality of laminated units comprising at least the pair of ferromagnetic layers with a nonmagnetic layer therebetween are laminated on the substrate.

In addition, it is preferable that the pair of ferromagnetic layers comprise at least two kinds of materials selected from a group consisting of an Ni—Fe alloy, Co, an Ni—Fe—Co alloy, Ni, and Fe; and the nonmagnetic layer comprises at least one kind of material selected from a group consisting of Au, Ag, Cu, and Cr.

A magnetoresistive multilayer film may be obtained by a method using a deposition apparatus;
the apparatus comprising at least;
- a first target for depositing a ferromagnetic layer to be formed on a substrate;
- a second target for depositing a nonmagnetic layer to be formed on the ferromagnetic layer;
- a third target for depositing a ferromagnetic layer to be formed on the nonmagnetic layer; and
- a fourth target for depositing an exchange bias layer to be formed on the ferromagnetic layer;

wherein at least one of the first target and the third target is arranged as an integrated target comprising a main target and an auxiliary target composed of a material different from the main target,
- the method comprising a step of laminating a ferromagnetic layer, a nonmagnetic layer, a ferromagnetic layer, and an exchange bias layer in that order on a substrate, while repeatedly transferring the substrate through all targets from near the first target to near the fourth target.

Moreover, a magnetoresistive multilayer film may be obtained by a method using a deposition apparatus;
the apparatus comprising at least;
- a first target for depositing a ferromagnetic layer to be formed on a substrate;

a second target for depositing a nonmagnetic layer to be formed on the ferromagnetic layer;

a third target for depositing a ferromagnetic layer to be formed on the nonmagnetic layer; and a fifth target for depositing a nonmagnetic layer to be formed on the ferromagnetic layer;

wherein at least one of the first target and the third target is arranged as an integrated target comprising a main target and an auxiliary target made of a material different from the main target, the method comprising a step of sequentially laminating laminated units comprising a ferromagnetic layer, a nonmagnetic layer, and a ferromagnetic layer, on a substrate, while repeatedly transferring the substrate through all targets from near the first target to near the fifth target.

DESCRIPTION OF THE PREFERRED EMBODIMENTS

Embodiments of the present invention are described below with reference to the drawings.

Figure 1:
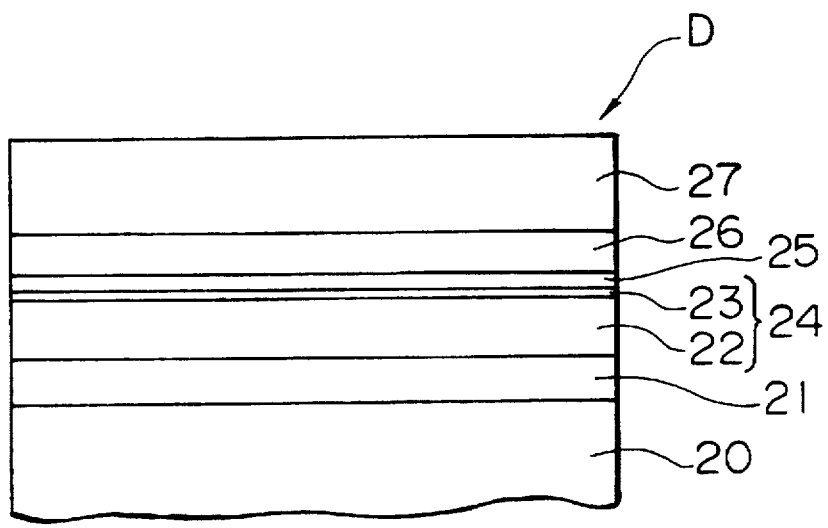
FIG. 1 is a lateral sectional view showing a magnetoresistive multilayer film structure in accordance with a first embodiment of the present invention.

FIG. 1 is a magnetoresistive multilayer film structure in accordance with a first embodiment of the present invention. In this embodiment, a magnetoresistive multilayer film structure D mainly comprises a buffer layer 21, a first ferromagnetic layer 24, a nonmagnetic layer 6 made of a nonmagnetic material, a second ferromagnetic layer 26 made of ferromagnetic materials, and an exchange bias layer 27 made of an antiferromagnetic material, which layers are sequentially provided on a nonmagnetic substrate 20 in that order. The first ferromagnetic layer 24 is composed of a main layer 22 made of a ferromagnetic material and a thin-film layer 23 also made of a ferromagnetic material.

The substrate 20 comprises a nonmagnetic material such as glass, Si, Al$_2$O$_3$, TiC, SiC, a sintered product of Al$_2$O$_3$ and TiC, or ferrite. The buffer layer 21 is made of a material including Ta, Zr, Nb, Fe, Cr, and the like, and is provided on the upper surface of the substrate to smooth irregularity and waviness thereof, or to improve the crystal conformity of the layers laminated on the substrate.

The main layer 22 and the second ferromagnetic layer 26 are composed of ferromagnetic thin-films, and practically, they are made of two kinds of ferromagnetic materials selected from a group consisting of an Fe—Ni alloy, Co, an Ni—Fe—Co alloy, Ni, and Fe. The thin-film layer 23 is preferably composed of Co because the spin-dependent scattering of conduction electrons at the interface between the nonmagnetic layer 23 and the first ferromagnetic layer 24 is most preferable to cause a higher magnetoresistance change when Co is used with respect to the nonmagnetic material. If the thickness of the thin-film layer 23 is less than 5 Å, satisfactory spin-dependent scattering of conduction electrons cannot be obtained, resulting in a decrease in the magnetoresistance change. Meanwhile, when the thickness excessively increases, a large coercive force due to Co impedes the rotation of the magnetization direction of the main layer 22, preventing the magnetization from smoothly rotating in response to a weak applied magnetic field. Thus, the thickness of the thin-film layer 23 is required to be in a range of from 5 Å to a maximum of one half of the thickness of the main layer 22.

An example of the preferable combination of the magnetic materials is such that the main layer 22 is composed of an Fe—Ni alloy and the thin-film layer 23 is composed of Co.

The nonmagnetic layer 25 is composed of a nonmagnetic substance, such as Cu, Cr, Au, or Ag, and preferably, a 20 Å to 40 Å thick Cu layer is used. When the thickness of the nonmagnetic layer 25 is less than 20 Å, a magnetic coupling readily occurs between the second ferromagnetic layer 26 and the main layer 22 or the thin-film layer 23. In addition, when the thickness is more than 40 Å, the efficiency of the conductive electrons passing through the interface between the nonmagnetic layer 25 and the second ferromagnetic layer 26 or between the nonmagnetic layer 25 and the thin-film layer 23 decreases, which efficiency is the factor causing the magnetoresistive effect. In other words, the magnetoresistive effect is unfavorably reduced by the shunt-current effect.

The exchange bias layer 27 is preferably composed of an antiferromagnetic material, such as an Fe—Mn alloy or Ni—Mn alloy. Further, a protective layer made of Ta, etc., may be provided outside thereof if required, and an insulating overcoat layer may be further provided on the protective layer. In this case, the overcoat layer preferably comprises an insulating material such as Ta, Al$_2$O$_3$, quartz or the like.

In the magnetoresistive multilayer film structure D shown in FIG. 1, the exchange bias layer 27 is in contact with the second ferromagnetic layer 26, and the magnetization direction of the second ferromagnetic layer 26 is pinned by a bias field due to the exchange coupling with the exchange bias layer 27. Thus, the magnetization direction of the second ferromagnetic layer 26 is not altered by an external magnetic field unless it affects the pinned state. Meanwhile, since the magnetization of the first ferromagnetic magnetic layer is not pinned, the magnetization direction thereof rotates in response to the external applied magnetic field. Consequently, the magnetization directions of the first ferromagnetic layer 24 and the second ferromagnetic layer 26 differ in the rotation angles, resulting in a magnetoresistance change.

From the above, it is said that a magnetoresistance change occurs by applying an external magnetic field, which fact enables detecting an external applied magnetic field by measuring the change occurring in the magnetoresistive multilayer film structure D shown in FIG. 1. Therefore, the magnetoresistive multilayer film structure D shown in FIG. 1 can be used as a magnetoresistive device for a magnetic head, position sensor, rotation sensor or the like.

In the magnetoresistive multilayer film structure D shown in FIG. 1 the first ferromagnetic layer 24 is made of the main layer 22 and the thin-film layer 23. This is because in such a magnetoresistance generating mechanism that has a structure comprising the first and the second ferromagnetic layers 24 and 26 with the nonmagnetic layer 25 therebetween, the possibility of producing a factor, other than the spin-dependent scattering of the conduction electrons, becomes lower when the first and the second ferromagnetic layers 24 and 26 are made of the same kind of material as compared with when the layers are made of different materials, resulting in a higher magnetoresistive effect. Therefore, when the second ferromagnetic layer 26 is made of Co, it is preferable that a portion of the first ferromagnetic layer 24 adjacent to the nonmagnetic layer 25 be replaced by the thin-film layer 23 which is made of Co and has a predetermined thickness.

Although the main layer 22 is made of a ferromagnetic substance, it is preferably made of a material having superior soft magnetic characteristics so as to enable the magnetization of the layer to rotate at a low magnetic field. Since the thin-film layer 23 is arranged satisfactorily thinner than the main layer 22, the magnetization of the layer can smoothly rotate as the first ferromagnetic layer 24 whole. Moreover, the layer is thick enough to exhibit a satisfactory effect in the spin-dependent scattering of the conduction electrons, resulting in a high change rate of magnetoresistance.

Figure 2:
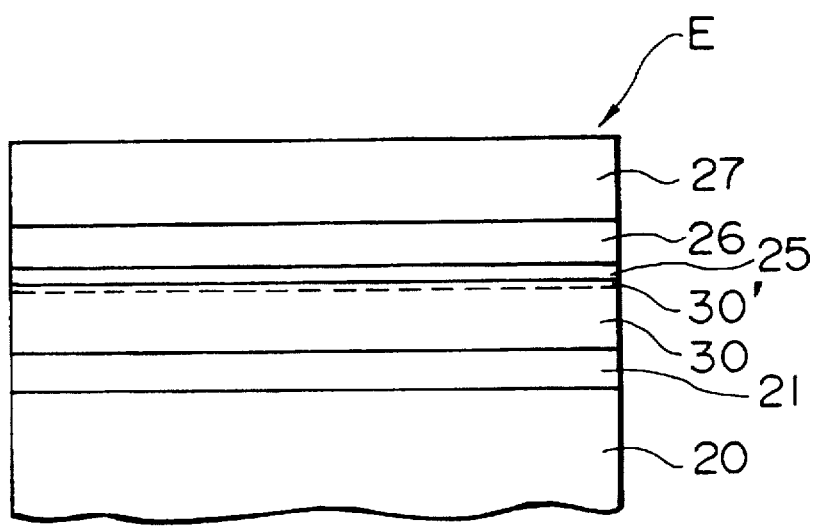
FIG. 2 is a lateral sectional view showing a magnetoresistive multilayer film structure in accordance with a second embodiment of the present invention.

FIG. 2 shows a magnetoresistive multilayer film structure E of the second embodiment incorporated in the present invention. In the second embodiment, the numerals used in the first embodiment identify the identical parts and the explanations concerning these identical parts are omitted. The magnetoresistive multilayer film structure E is mainly composed of the buffer layer 21, a first ferromagnetic layer 30, the nonmagnetic layer 25 made of a nonmagnetic substance, the second ferromagnetic layer 26, and the exchange bias layer 27 made of an antiferromagnetic substance, which layers are sequentially laminated in that order on a substrate made of a nonmagnetic substance.

The first ferromagnetic layer 30 is composed of a similar magnetic substance to that consisting the main layer 22 in the first embodiment, except that it comprises a Co concentration gradient in which the Co concentration gradually increases in the direction toward the nonmagnetic layer 25. Moreover in the first ferromagnetic layer 30, the portion adjacent to the buffer layer 21 does not contain Co, and the Co concentration gradually increases from the middle of the layer thickness and reaches 80 at % in a mixed layer 30' approximately 5 Å thick measuring from the interface with the nonmagnetic layer 25.

The mixed layer 30' has a similar function to the thin-film layer 23 of the first embodiment. The material combination of the nonmagnetic layer 25 and the first ferromagnetic layer 30 in the interface therebetween is Cu and Co, which combination generates a large magnetoresistance change. Thus similar advantages to the first embodiment are achieved in the second embodiment. In addition, the second embodiment does not have the interface existing between the main layer 22 and the thin-film layer 23 of the first embodiment. Therefore, the conduction electrons are not excessively scattered in the first ferromagnetic layer 30, providing a larger change in magnetoresistance compared with the first embodiment.

Figure 3:
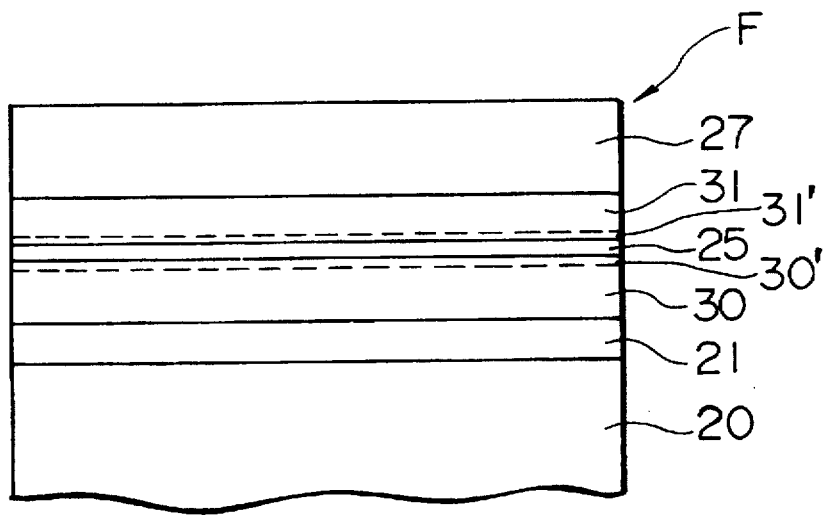
FIG. 3 is a lateral sectional view showing a magnetoresistive multilayer film structure in accordance with a third embodiment of the present invention.

FIG. 3 shows a magnetoresistive multilayer film structure F of the third embodiment incorporated in the present invention. In the third embodiment, the numerals used in the second embodiment identify the identical parts and the explanations concerning these parts are omitted. The magnetoresistive multilayer film structure F is mainly composed of the buffer layer 21, the first ferromagnetic layer 30, the nonmagnetic layer 25 made of a nonmagnetic substance, a second ferromagnetic layer 31, and the exchange bias layer 27 made of an antiferromagnetic substance, which layers are sequentially laminated in that order on a substrate made of a nonmagnetic substance.

The first and the second ferromagnetic layers 30 and 31 are characterized in that both layers contain Co and the ferromagnetic layer 31 has a Co concentration gradient gradually increasing in the direction toward the nonmagnetic layer 25.

Although, the concentration gradient is prepared for only one ferromagnetic layer not adjacent to the exchange bias layer 27 in the second embodiment, similar advantages are achieved when both ferromagnetic layers are provided with the concentration gradients, as is shown in the third embodiment.

In this embodiment, the first and the second ferromagnetic layers 30 and 31 are composed of an Ni—Fe alloy containing Co so as to provide the concentration gradients therein such that mixed layers 30' and 31' of a high Co concentration sandwich the nonmagnetic layer 25. Since it is known that a magnetoresistive device exhibits the highest magnetoresistive effect when it has Co layers sandwiching a nonmagnetic layer, the structure incorporated in the third embodiment provides a magnetoresistive effect similar to that of the second embodiment and superior to that of the first embodiment.

Figure 4:
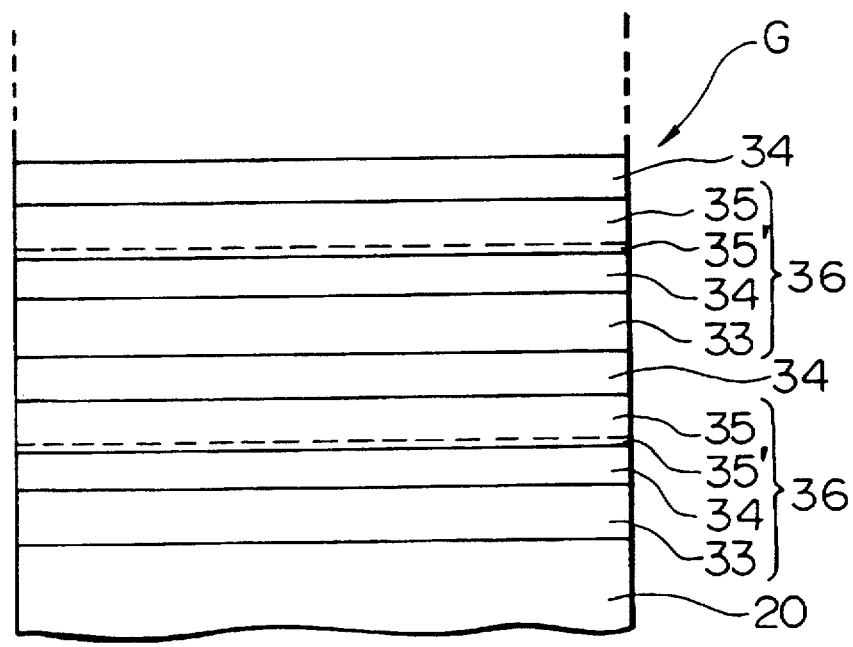
FIG. 4 is a lateral sectional view showing a magnetoresistive multilayer film structure in accordance with a fourth embodiment of the present invention.

FIG. 4 shows a magnetoresistive multilayer film structure G of the fourth embodiment incorporated in the present invention. The magnetoresistive multilayer film structure G is arranged such that a plurality of laminated units 36 are laminated with nonmagnetic layers 36 therebetween on a substrate made of a nonmagnetic substance, wherein each of the laminated units 36 is composed of a hard magnetic layer 33 made of a hard magnetic material, a nonmagnetic layer 34, and a soft magnetic layer 35 made of a soft magnetic material. The lower portion of each of the soft magnetic layer, that is, the portion near the nonmagnetic layer 34, disposed between the soft magnetic layer 35 and the hard magnetic layer 33, is provided with a thin layer 35' of a high Co concentration. The hard magnetic layer 33 is preferably composed of Co or an alloy having a large Co content, such as a Co—Pt alloy or a Co—Cr alloy, while the soft magnetic layer 35 is preferably composed of an Ni—Fe alloy. The nonmagnetic layer 34 is made of a similar material to the nonmagnetic layer 25 of the first embodiment, and in particular, it is preferably composed of Cu.

Since the magnetoresistive multilayer film structure G is obtained by laminating the hard magnetic layer 33 and a soft magnetic layer 35 with a nonmagnetic layer 4 therebetween, the ferromagnetic layers sandwiching the nonmagnetic layer 34 exhibit a coercive-force difference, resulting in a magnetoresistive effect.

Further, since the soft magnetic layer 35 has a thin layer 35' of a high Co concentration, in this embodiment, the nonmagnetic layer 34 is arranged between the thin layer 35' of a high Co concentration and the hard magnetic layer 33 composed of Co or a Co—type alloy, in other words, both sides of the nonmagnetic layer 34 are adjacent to the portions containing Co. Therefore, a high magnetoresistive effect can be obtained. In addition, according to this embodiment, it is possible to achieve a high magnetoresistive effect corresponding to the number of the laminated layers, since the desired number of the laminated units 36 can be formed.

A fabricating method for a magnetoresistive multilayer film structure will be described referring to FIG. 5, which structure is obtained by coating a protective layer on the magnetoresistive multilayer film structure C of the first embodiment.

Figure 5:
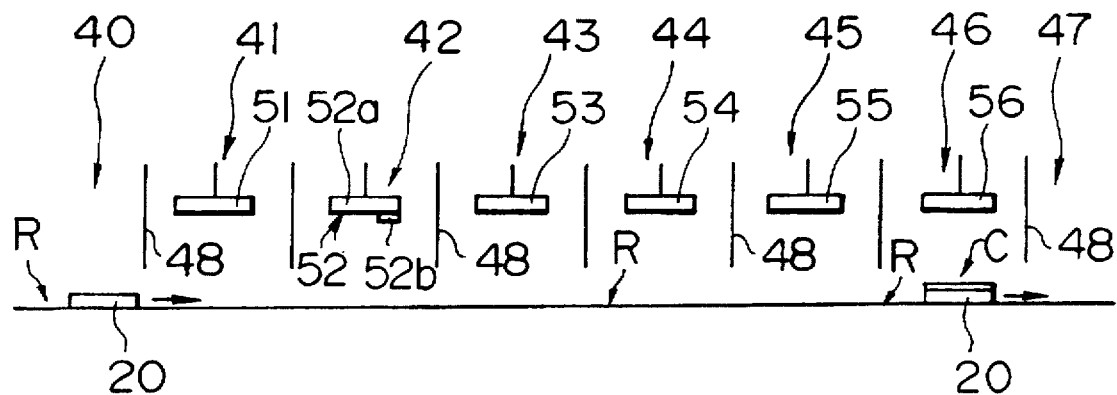
FIG. 5 is a lateral view showing an apparatus for manufacturing a magnetoresistive multilayer film structure in accordance with the present invention.

FIG. 5 diagrammatically illustrates a sputtering apparatus having a plurality of deposition chambers horizontally connected in a line. The sputtering apparatus of this embodiment has an inlet chamber 40, deposition chambers 41, 42, 43, 44, 45, and 46, and an outlet chamber 47, which are arranged in a line and separated from one another by separators 48. Each of the chambers is airtightly sealed so as to control an inert-gas atmosphere thereof to a predetermined low pressure.

The upper portions of the chambers are provided with the corresponding targets. Those chambers are connected through a substrate transferring route R, along which a substrate 20 is transferred and subjected to the required deposition performed by the targets while passing through each chamber.

In the sputtering apparatus of this embodiment, an auxiliary target made of Ta is provided for the deposition chamber 41, a first integrated target composed of a main target 52a made of an Ni—Fe alloy and an auxiliary target 52b made of Co pellet is provided for the deposition chamber 42, a second target 53 made of Cu is provided for the deposition chamber 43, a third target 54 made of Co or an Ni—Fe alloy is provided for the deposition chamber 44, a fourth target 55 made of an Fe—Mn alloy is provided for the deposition chamber 45, and a target 46, for the protective film, made of Ta is provided for the deposition chamber 46.

To fabricate the magnetoresistive multilayer film structure D, coated with a protective layer thereon, of the first embodiment by the foregoing sputtering apparatus, the Ar atmosphere of the deposition chambers is controlled to a low pressure. Then each of the layers is deposited on the substrate 20 while transferring the substrate 20 from the inlet chamber 40 to the deposition chamber 46 along the substrate transferring route R at a predetermined rate.

The buffer layer 21 of Ta is provided on the substrate 20 in the deposition chamber 41. After depositing the buffer layer 21 having a predetermined thickness, the substrate 20 is transferred to the deposition chamber 42 to form a main layer 22 of an Ni—Fe alloy on the buffer layer 21. During the transfer along the substrate-transferring route R, the substrate 20 passes under the Co pellet 52b positioned near the deposition chamber 43, thus the thin-film layer 23 of Co is substantially formed at that time. After depositing a predetermined thickness of the thin-film layer 23, the substrate 20 is transferred to the deposition chamber 43 to form the nonmagnetic layer 25 of Cu. Then, the ferromagnetic layer 26 of an Fe—Ni alloy or Co is formed in the deposition chamber 44, the ferromagnetic layer 27 of an Fe—Mn alloy is formed in the deposition chamber 45, and finally, the protective layer of Ta is formed in the deposition chamber 46 to complete the magnetoresistive multilayer film structure D coated with a protective layer, as shown in FIG. 1.

Figure 6:
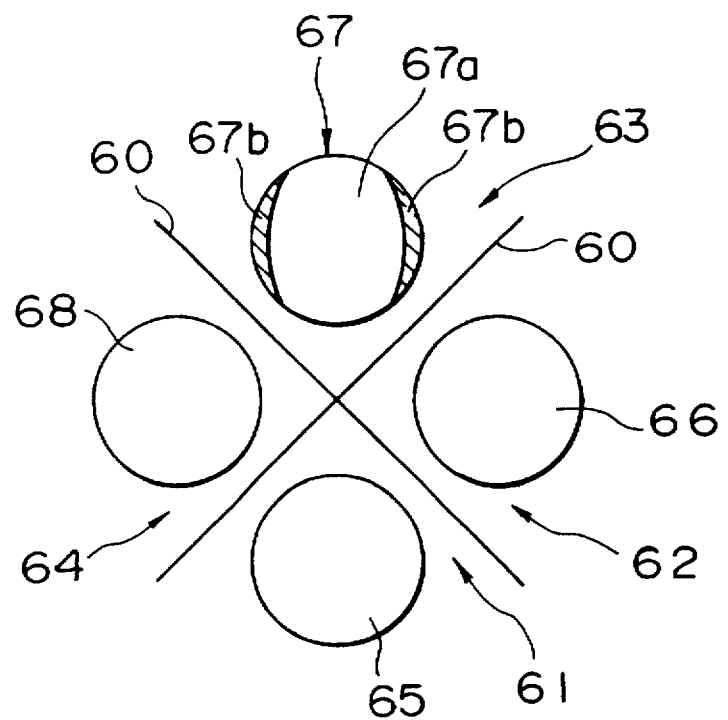
FIG. 6 is a lateral view showing another apparatus for manufacturing a magnetoresistive multilayer film structure in accordance with the present invention.
Figure 7:
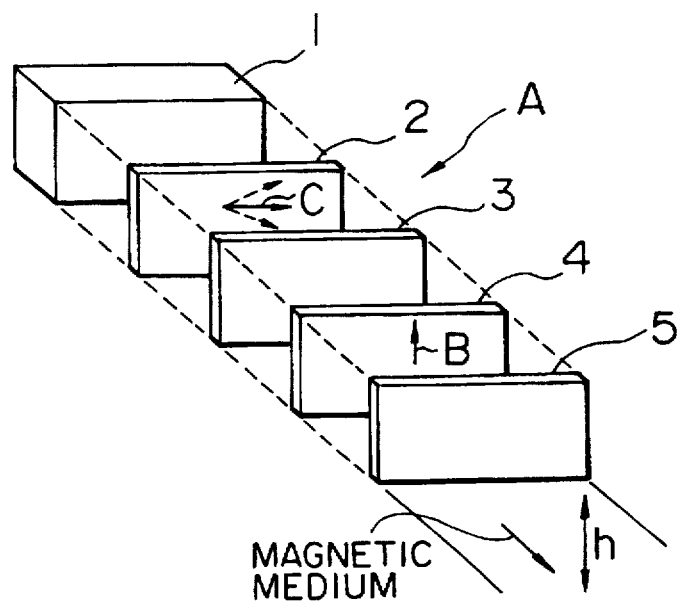
FIG. 7 is an perspective exploded view showing a first example of a conventional magnetoresistive sensor.
Figure 8:
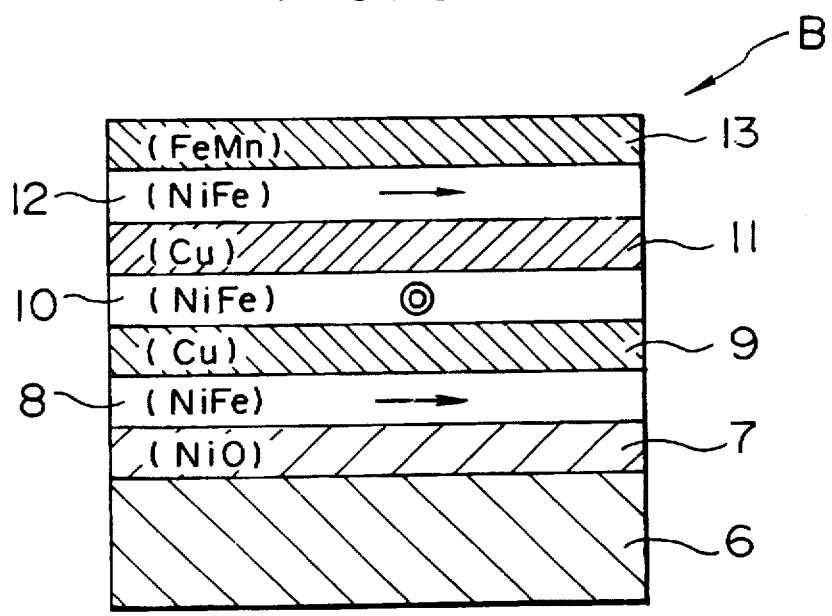
FIG. 8 is a sectional view showing a second example of a conventional magnetoresistive sensor.
Figure 9:
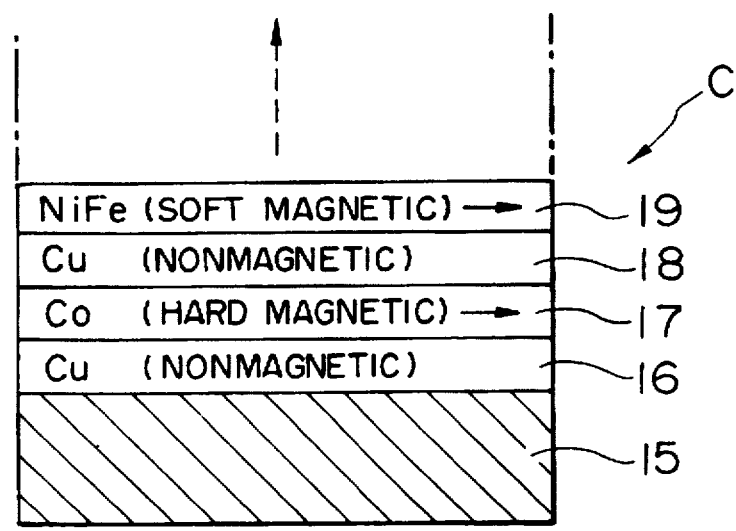
FIG. 9 is a sectional view showing a third example of a conventional magnetoresistive head.

FIG. 6 illustrates an example of a deposition apparatus composed of four deposition chambers 61, 62, 63, and 64, which are divided by separators 60 forming a cross.

In this apparatus, a supporting base in the shape of a rotating table is arranged below the target of the deposition chamber, and a substrate 20 is placed on the supporting base to be transferred to each of the deposition chambers. A first target 65 made of Co pellet is provided for the deposition chamber 61, a second target 66 made of Cu is provided for the deposition chamber 62, a third integrated target composed of a main target 67a made of an Ni—Fe alloy and an auxiliary target 67b made of Co is provided for the deposition chamber 63, a fourth target 68 made of Cu is provided for the deposition chamber 64.

According to this apparatus, a hard magnetic layer 33 made of Co is formed on the substrate 20 in the deposition chamber 61, a nonmagnetic layer 34 made of Cu is formed in the deposition chamber 62, a soft magnetic layer made of an Ni—Fe alloy and a layer of a high Co concentration is formed in the deposition chamber 63, and a nonmagnetic magnetic layer 34 made of Cu is formed in the deposition chamber 64. Therefore, a magnetoresistive multilayer film structure G having the desired number of layers is obtained by repeating the substrate transfer in the above order.

By using this apparatus, cost reduction in apparatus and production is advantageously achieved because the magnetoresistive multilayer film structure G is fabricated by only four targets 65, 66, 67, and 68.

FIRST PRODUCTION EXAMPLE

A magnetoresistive multilayer film structure shown in FIG. 1 was formed by laminating layers on a glass substrate (#0100, produced by Matsunami Glass Co., Ltd.) using a sputtering apparatus having targets arranged as shown in FIG. 5. In this example, the buffer layer comprising Ta had a thickness of 50 Å, the main layer comprising an Ni—Fe alloy had a thickness of 70 Å, the thin-film layer comprising Co had a thickness of 5 Å, the nonmagnetic layer comprising Cu had a thickness of 20 Å, the ferromagnetic layer comprising Co had a thickness of 50 Å, and the exchange bias layer comprising an Fe—Mn alloy had a thickness of 110 Å. The thin-film layer of Co was deposited separately by stopping the substrate transfer at the position under the Co pellet for a predetermined time. During sputtering, the Ar gas pressure was set to 3 mTorr and a magnetic field of 100 Oe parallel to the surface of the substrate was applied.

The thus-obtained sample of the magnetoresistive multilayer film structure exhibited a high change rate of magnetoresistance ($\Delta MR$) of 6.8%.

SECOND PRODUCTION EXAMPLE

A magnetoresistive magnetic film structure shown in FIG. 2 was formed on a glass substrate (#0100, produced by Matsunami Glass Co., Ltd.) by laminating layers using a sputtering apparatus having targets arranged as shown in FIG. 5. In this example, the buffer layer comprising Ta had a thickness of 50 Å, the ferromagnetic layer comprising an Ni—Fe alloy had a thickness of 75 Å, the layer of a high Co concentration had a thickness of 5 Å, the nonmagnetic layer comprising Cu had a thickness of 20 Å, the ferromagnetic layer comprising Co had a thickness of 50 Å, and the exchange bias layer comprising an Fe—Mn alloy had a thickness of 110 Å. Other conditions required for deposition were similar to those of the first production example.

The thus-obtained sample of the magnetoresistive multilayer film structure exhibited a high change rate of magnetoresistance ($\Delta MR$) of 7.5%.

THIRD PRODUCTION EXAMPLE

Using a sputtering apparatus having targets arranged as shown in FIG. 6, a magnetoresistive magnetic film structure shown in FIG. 4 was obtained by repeatedly (five times) laminating laminated units composed of a Co layer, a Cu layer, and an Ni—Fe alloy layer including a layer of high concentration Co on a silicon wafer substrate (100).

The conditions for sputtering were such that high-frequency power was set to 100 W for the Co layer and the Ni—Fe alloy layer containing a layer of a high concentration Co and 75 W for the Cu layer, and the Ar gas pressure was set to 3 mTorr. The thickness of the layers was 15 Å for the Co layer, 40 Å for the Cu layer, and 15 Å for the Ni—Fe alloy layer, in which the layer of a high concentration Co was 5 Å thick. After the deposition, the layers were subjected to heating at 300° C. for 10 min.

The thus-obtained sample of the magnetoresistive multilayer film structure exhibited a high change rate of magnetoresistance ($\Delta$MR) of 8.5%.

As above described, according to the present invention, the ferromagnetic layers are provided with a nonmagnetic layer therebetween such that at least one of the ferromagnetic layers is composed of two different kinds of magnetic materials and the nonmagnetic-layer sides of the ferromagnetic layers opposed to each other with the nonmagnetic layer therebetween are made of the same kind of magnetic material. It is therefore possible to employ such a material combination for the nonmagnetic layer and the ferromagnetic layers that provides the largest change in electrical resistance, that is, a combination of Cu and Co or a Co alloy including 10 at %, of Fe. Additionally, a sensitive change in electrical resistance is also achieved at a low magnetic field because the main layer, which is included in the layer comprising different magnetic materials and does not face to the nonmagnetic layer, can be composed of an Ni—Fe alloy.

Therefore, the magnetoresistive multilayer film structure of the present invention can be suitably applied to a magnetoresistive device used for a magnetic head, position sensor, rotation sensor or the like.

Moreover, as the ferromagnetic layers comprising two different kinds of magnetic materials, a two-layer structure composed of a thin-film layer and a main layer may be employed, or a structure in which one ferromagnetic layer has a concentration gradient of a constituent of the other ferromagnetic layer may be used. The latter is preferable because no excessive magnetic field is left in the ferromagnetic layer according to the layer with the concentration gradient, providing an increase in the change rate of magnetoresistance.

Meanwhile, the magnetization direction of one ferromagnetic layer can be fixed by providing an exchange layer in contact with the ferromagnetic layer. When the magnetization direction of the other ferromagnetic layer rotates corresponding to an external magnetic field, the rotation angle of the magnetization direction differs between those ferromagnetic layers, thus providing a magnetoresistance change.

Further, when a structure on the substrate is composed of a plurality of laminated units comprising at least a pair of ferromagnetic layers with a nonmagnetic layer therebetween, the magnetization directions of the ferromagnetic layers are aligned in parallel or antiparallel depending on the presence or absence of the applied magnetic field. Thus, a magnetoresistance change is obtained corresponding to the change in alignment.

Meanwhile, at the time of fabricating the foregoing magnetoresistive multilayer film structure by using a deposition apparatus equipped with the first to the fourth targets, it is possible to deposit a ferromagnetic layer composed of two different kinds of magnetic materials on a substrate if at least one of the second and third targets is composed of a main target and an auxiliary target.

Therefore, according to the method of the present invention, a magnetoresistive multilayer film structure is fabricated such that at least a pair of ferromagnetic layers with a nonmagnetic layer therebetween are provided on a substrate and at least one of the ferromagnetic layers comprises two different kinds of magnetic materials.

Further, by using first to third targets and the fifth target, in which the second target is arranged as an integrated target composed of a main and an auxiliary targets, a magnetoresistive multilayer film structure is also fabricated such that ferromagnetic layers are provided with a nonmagnetic layer therebetween and at least one of the ferromagnetic layers comprises two different kinds of magnetic materials. Furthermore, in the foregoing case, the cost reduction in apparatus and production is advantageously achieved because the number of targets can be decreased by utilizing the integrated target.

What is claimed is:

1. A magnetoresistive multilayer film comprising:
   a first ferromagnetic layer comprising:
      a main layer comprising a material selected from the group consisting of Fe—Ni alloy Ni—Fe—Co alloy, Ni and Fe; and
      a thin layer consisting of Co;
   a second ferromagnetic layer comprising a material selected from the group consisting of Fe—Ni alloy, Ni—Fe—Co alloy, Co, Ni and Fe; and
   a nonmagnetic layer coupling the first ferromagnetic layer to the second ferromagnetic layer;
   wherein the magnetization of the first ferromagnetic layer rotates freely in response to an external magnetic field, and the magnetization of the second ferromagnetic layer is pinned and does not rotate freely in response to an external magnetic field.

2. The magnetoresistive multilayer film according to claim 1, further comprising an exchange bias layer coupled to the second ferromagnetic layer for pinning the magnetization direction of said second ferromagnetic layer.

3. The magnetoresistive multilayer film according to claim 1, wherein said nonmagnetic layer comprises at least one kind of material selected from the group consisting of Au, Ag, Cu, and Cr.

4. The magnetoresistive multilayer film according to claim 1, wherein the main layer is composed of an Fe—Ni alloy and the thin layer is composed of Co.

5. The magnetoresistive multilayer film according to claim 1, wherein the thickness of said thin layer, as measured from the interface with the nonmagnetic layer, ranges from 5 Å to one half the thickness of said main layer.

6. A magnetoresistive multilayer film comprising:
   a first ferromagnetic layer comprising Co;
   a second ferromagnetic layer; and
   a nonmagnetic layer coupling the first ferromagnetic layer to the second ferromagnetic layer, wherein the concentration of Co in said first ferromagnetic layer is higher near said nonmagnetic layer;
   wherein the magnetization of the first ferromagnetic layer rotates freely in response to an external magnetic field, and the magnetization of the second ferromagnetic layer is pinned and does not rotate freely in response to an external magnetic field.

7. The magnetoresistive multilayer film according to claim 6, further comprising an exchange bias layer coupled to the second ferromagnetic layer for pinning the magnetization direction of said second ferromagnetic layer.

8. The magnetoresistive multilayer film according to claim 6, wherein said nonmagnetic layer comprises at least one kind of material selected from the group consisting of Au, Ag, Cu, and Cr.

9. The magnetoresistive multilayer film according to claim 6, wherein said first ferromagnetic layer comprises a region having at least 80% atomic weight concentration of Co, said region having a thickness, as measured from the interface with the nonmagnetic layer, ranging from 5 Å to one half the thickness of said second ferromagnetic layer.

10. The magnetoresistive multilayer film according to claim 6, wherein the concentration of Co in said first ferromagnetic layer is gradually higher toward the direction of said nonmagnetic layer.

11. The magnetoresistive multilayer film according to claim 6, wherein said second ferromagnetic layer comprises a material selected from the group consisting of Fe—Ni alloy, Ni—Fe—Co alloy, Co, Ni and Fe.

12. The magnetoresistive multilayer film according to claim 6, comprising multiple units of said first and second ferromagnetic layers and said nonmagnetic layer, said units coupled to adjacent units by a second nonmagnetic layer.

13. The magnetoresistive multilayer film according to claim 9, further comprising an exchange bias layer coupled to the second ferromagnetic layer for pinning the magnetization direction of said second ferromagnetic layer.

14. The magnetoresistive multilayer film according to claim 9, wherein said nonmagnetic layer comprises at least one kind of material selected from the group consisting of Au, Ag, Cu, and Cr.

15. The magnetoresistive multilayer film according to claim 10, wherein said first ferromagnetic layer comprises a region having at least 80% atomic weight concentration of Co, said region having a thickness of approximately 5 Å as measured from the interface with said nonmagnetic layer.

16. The magnetoresistive multilayer film according to claim 10, wherein said first ferromagnetic layer comprises a region having no concentration of Co, said region located away from said nonmagnetic layer.

17. The magnetoresistive multilayer film according to claim 10, wherein said first and second ferromagnetic layers comprise a material of Ni—Fe alloy containing Co.

18. The magnetoresistive multilayer film according to claim 10, wherein said second ferromagnetic layer comprises a region having no concentration of Co, said region located away from said nonmagnetic layer.

19. The magnetoresistive multilayer film according to claim 12, wherein the second ferromagnetic layer of a first one of said multiple units couples a substrate to said first unit.

20. The magnetoresistive multilayer film according to claim 17, wherein concentration of Co in said second ferromagnetic layer is gradually higher toward the direction of said nonmagnetic layer.

21. The magnetoresistive multilayer film according to claim 20, wherein said second ferromagnetic layer comprises a region having at least 80% atomic weight concentration of Co, said region having a thickness of approximately 5 Å as measured from the interface with said nonmagnetic layer.

22. A method of producing a magnetoresistive multilayer film by using a deposition apparatus; said apparatus comprising:

a first target for depositing a first ferromagnetic layer to be formed on a substrate;

a second target for depositing a nonmagnetic layer to be formed on said first ferromagnetic layer;

a third target for depositing a second ferromagnetic layer to be formed on said nonmagnetic layer; and a fourth target for depositing an exchange bias layer to be formed on said second ferromagnetic layer;

wherein at least one of said first target and said third target is arranged as an integrated target comprising a main target and an auxiliary target composed of a material different from said main target, said method comprising the steps of depositing said first ferromagnetic layer, said nonmagnetic layer, said second ferromagnetic layer, and said exchange bias layer in that order on said substrate, while repeatedly transferring said substrate through all targets from near said first target to near said fourth target.

23. The method according to claim 22, wherein said main target is composed of an Ni—Fe alloy and said auxiliary target is composed of Co.

24. A method of producing a magnetoresistive multilayer film by using a deposition apparatus; said apparatus comprising;

a first target for depositing a first ferromagnetic layer to be formed on a substrate;

a second target for depositing a first nonmagnetic layer to be formed on said first ferromagnetic layer;

a third target for depositing a second ferromagnetic layer to be formed on said first nonmagnetic layer; and a fourth target for depositing a second nonmagnetic layer to be formed on said second ferromagnetic layer;

wherein at least one of said first target and said third target is arranged as an integrated target comprising a main target and an auxiliary target made of material different from said main target, said method comprising the steps of sequentially depositing said first ferromagnetic layer, said first nonmagnetic layer, said second ferromagnetic layer, and said second nonmagnetic layer on said substrate, while repeatedly transferring said substrate through all targets from near said first target to near said fourth target.

25. The method according to claim 24, wherein said main target is composed of an Ni—Fe alloy and said auxiliary target is composed of Co.

* * * * *